United States Patent
Kuo et al.

(10) Patent No.: US 6,943,103 B2
(45) Date of Patent: Sep. 13, 2005

(54) METHODS FOR REDUCING FLIP CHIP STRESS

(75) Inventors: Yia-Liang Kuo, Hsinchu (TW); Yu-Chang Lin, Hsinchu (TW); Yu-Ting Lin, Hsin-chu (TW)

(73) Assignee: Tawian Semiconductor Manufacturing Co., Ltd., Hsin Chu (TW)

( * ) Notice: Subject to any disclaimer, the term of this patent is extended or adjusted under 35 U.S.C. 154(b) by 35 days.

(21) Appl. No.: 10/768,848

(22) Filed: Jan. 29, 2004

(65) Prior Publication Data

US 2005/0170630 A1 Aug. 4, 2005

(51) Int. Cl.[7] .............................................. H01L 21/44

(52) U.S. Cl. ...................... 438/613; 438/108; 438/612; 438/106

(58) Field of Search ................................ 438/613, 612, 438/106, 107, 108, 109, 110, 455

(56) References Cited

U.S. PATENT DOCUMENTS

| | | | |
|---|---|---|---|
| 6,214,643 B1 * | 4/2001 | Chiu ........................... | 438/108 |
| 6,462,425 B1 * | 10/2002 | Iwasaki et al. ............. | 257/780 |
| 6,479,900 B1 * | 11/2002 | Shinogi et al. ............. | 257/758 |
| 6,686,665 B1 * | 2/2004 | Gao et al. ................... | 257/781 |

* cited by examiner

*Primary Examiner*—David Nhu
(74) *Attorney, Agent, or Firm*—Tung & Associates

(57) ABSTRACT

Novel methods for reducing shear stress applied to solder bumps on a flip chip. The methods are particularly applicable to reducing temperature-induced shear stress on solder bumps located adjacent to an empty space on a flip chip during high-temperature testing of the chip. According to a first embodiment, the method includes providing an anchoring solder bump in each empty space on the flip chip. The anchoring solder bumps impart additional structural integrity to the flip chip and prevent shear-induced detachment of solder bumps from the flip chip, particularly those solder bumps located adjacent to each anchoring solder bump. According to a second embodiment, the method includes providing an anchoring solder bump in the empty space and then connecting the anchoring solder bump to an adjacent solder bump on the chip using a solder bridge.

20 Claims, 2 Drawing Sheets

METHODS FOR REDUCING FLIP CHIP STRESS

FIELD OF THE INVENTION

The present invention relates to flip chip packaging of semiconductor integrated circuits. More particularly, the present invention relates to methods for reducing stress on solder bumps provided on an IC chip in flip chip packaging technology.

BACKGROUND OF THE INVENTION

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Package types for IC chips can be broadly classified into two groups: hermetic-ceramic packages and plastic packages. A chip packaged in a hermetic package is isolated from the ambient environment by a vacuum-tight enclosure. The package is typically ceramic and is utilized in high-performance applications. A chip packaged in a plastic package, on the other hand, is not completely isolated from the ambient environment because the package is composed of an epoxy-based resin. Consequently, ambient air is able to penetrate the package and adversely affect the chip over time. Recent advances in plastic packaging, however, has expanded their application and performance capability. Plastic packages are cost-effective due to the fact that the production process is typically facilitated by automated batch-handling.

A recent development in the packaging of IC chips is the ball grid array (BGA) package, which may be utilized with either ceramic packages or plastic packages and involves different types of internal package structures. The BGA package uses multiple solder balls or bumps for electrical and mechanical interconnection of IC chips to other microelectronic devices. The solder bumps serve to both secure the IC chip to a circuit board and electrically interconnect the chip circuitry to a conductor pattern formed on the circuit board. The BGA technique is included under a broader connection technology known as "Controlled Collapse Chip Connection-C4" or "flip-chip" technology.

Flip chip technology can be used in conjunction with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Because of the numerous functions typically performed by the microcircuitry of a flip chip, a relatively large number of solder bumps are often required. The size of a flip chip is typically on the order of about thirteen millimeters per side or greater, resulting in crowding of the solder bumps on the flip chip. Consequently, flip chip conductor patterns are typically composed of numerous individual conductors that are often spaced apart at a pitch of typically about 150 um to 250 um.

A section of a typical conventional flip chip 26 is shown schematically in FIG. 1 and includes a solder bump 10 which is soldered to an under-bump metal (UBM) 11 provided on the continuous upper surface of a bump pad 14, typically rectangular in configuration, as shown in FIG. 1A, and partially covered by a passivation layer 12 which may be SiN or $SiO_2$, for example. Some samples have a polyimide layer on the passivation layer 12 to resist the impact of alpha particles. A circular pad opening 13 in the passivation layer 12 exposes the bump pad 14, through which pad opening 13 the solder bump 10 extends. The bump pad 14 is surrounded by a dielectric layer 15 (which is typically covered by the passivation layer 12) such as an oxide in the chip 26. As further shown in FIG. 1, the bump pad 14 is provided in electrical contact with an upper conductive layer 16, which is separated from an underlying conductive layer 22 by an insulative layer 18. The conductive layers 16, 22 are disposed in electrical contact with each other through conductive vias 20 that extend through the insulative layers 18. The various insulative layers 18 and conductive layers 22 are sequentially deposited on a silicon chip substrate 24 throughout semiconductor fabrication, in conventional fashion. An RDL (re-distribution line, not shown) typically connects solder bumps 10 to an IO pad (not shown) which is provided typically at the edges of the flip chip 26.

After the solder bumps 10 are formed on the flip chip 26, the chip 26 is inverted (thus the term, "flip chip") and the solder bumps 10 are bonded to electrical terminals in a substrate 28 such as a printed circuit board (PCB). As shown in FIG. 1B, the solder bumps 10 are typically provided on the flip chip 26 in a series of rows and columns. Frequently, an empty space 11 is left between adjacent solder bumps 10 in the rows and columns on the flip chip 26 due to the configuration of integrated circuits fabricated on the chip substrate 24 or other considerations.

After the solder bumps 10 are bonded to the PCB substrate 28, the flip chip 26 is subjected to a variety of tests such as, for example, bump shear tests and die shear tests, in which shear stress is applied to the flip chip 26 to determine the mechanical integrity of the electrical connections between the flip chip 26 and the bonded PCB substrate 28. The flip chip 26 may also be subjected to temperature tests, in which the flip chip 26 is subjected to cycling temperatures of typically about −55~125 degrees C.

As shown in FIG. 1C, during high-temperature testing of the flip chip 26, the PCB substrate 28 expands at a higher rate than does the silicon chip substrate 24 and various insulative layers 18 and conductive layers 22 (FIG. 1) on which the solder bumps 10 are provided. This exerts considerable shear stress on the solder bumps 10, causing some of the solder bumps 10 to become detached or "lifted" from the dielectric layer 15 on the chip substrate 24. The highest magnitude of this temperature-induced shear stress is applied to those solder bumps 10 that are located adjacent to an empty space 11 between adjacent solder bumps 10 on the dielectric layer 15, as indicated by the arrows in FIG. 1B, since there exists no solder bump 10 in the empty space 11 to absorb and resist a portion of the shear stress applied to the flip chip 26. The temperature-induced shear stress is particularly acute for those solder bumps 10 that are located at the corners 26a and, to a somewhat lesser degree, at the edges 26b of the flip chip 26.

It has been found that providing an anchoring solder bump in an empty space between solder bumps on a flip chip significantly stabilizes the solder bumps located adjacent to the anchoring solder bump during temperature testing of the flip chip, since the anchoring solder bump provides an additional structure to resist and absorb the temperature-induced shear stress applied to the flip chip. This substantially prevents or reduces detachment or "lifting" of the solder bumps from the flip chip as the PCB substrate expands at a faster rate than the chip substrate and insulative and conductive layers thereon, resulting in a flip chip product having enhanced functional and structural integrity.

Accordingly, an object of the present invention is to provide novel methods suitable for reducing stress applied to solder bumps on a flip chip.

Another object of the present invention is to provide novel methods which are particularly effective in reducing stress applied to solder bumps on a flip chip during testing of the chip.

Still another object of the present invention is to provide novel methods which are particularly effective in reducing stress applied to solder bumps on a flip chip during high-temperature testing of the chip.

Yet another object of the present invention is to provide novel methods which may be used to reduce shear stress applied to solder bumps that are located adjacent to an empty space on a chip substrate.

A still further object of the present invention is to provide a novel method which includes providing an anchoring solder bump in an empty space on a chip substrate to reduce shear stress applied to solder bumps located adjacent to the empty space.

Yet another object of the present invention is to provide a novel method which includes providing an anchoring solder bump in an empty space on a chip substrate and providing a solder bridge between the anchoring solder bump and an adjacent solder bump on the chip substrate to reduce shear stress applied to solder bumps located adjacent to the empty space.

SUMMARY OF THE INVENTION

In accordance with these and other objects and advantages, the present invention is generally directed to novel methods for reducing shear stress applied to solder bumps on a flip chip. The methods are particularly applicable to reducing temperature-induced shear stress on solder bumps located adjacent to an empty space on a flip chip during high-temperature testing of the chip. According to a first embodiment, the method includes providing an anchoring solder bump in each empty space on the flip chip. The anchoring solder bumps impart additional structural integrity to the flip chip and prevent shear-induced detachment of solder bumps from the flip chip, particularly those solder bumps located adjacent to each anchoring solder bump. According to a second embodiment, the method includes providing an anchoring solder bump in the empty space and then connecting the anchoring solder bump to an adjacent solder bump on the chip using a solder bridge.

BRIEF DESCRIPTION OF THE DRAWINGS

The invention will now be described, by way of example, with reference to the accompanying drawings, in which.

DESCRIPTION OF THE PREFERRED EMBODIMENTS

The present invention includes methods for reducing shear stress applied to solder bumps on a semiconductor flip chip particularly during testing of the flip chip after packaging. The methods are particularly applicable to reducing heat-induced shear stress applied to solder bumps during cyclic temperature testing of a flip chip. However, the methods are also effective in increasing the mechanical stability of solder bumps on a flip chip during mechanically-induced shear testing of the flip chip. The methods result in a flip chip that is characterized by high structural and functional integrity.

Figure 1:
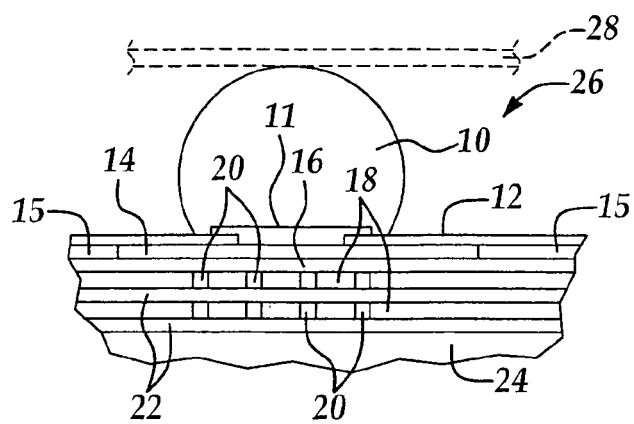
FIG. 1 is a cross-sectional view illustrating a typical conventional solder bump and bump pad construction of a semiconductor flip chip.
Figure 1A:
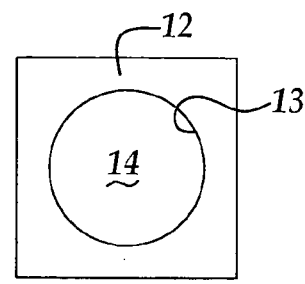
FIG. 1A is a top schematic view illustrating a typical conventional solder bump and bump pad construction of a semiconductor flip chip.
Figure 1B:
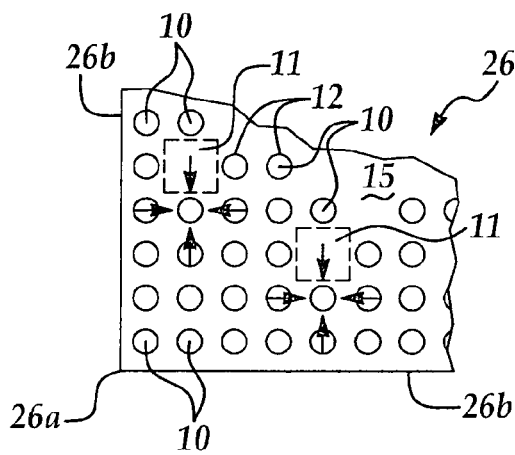
FIG. 1B is a top view of a section of a conventional flip chip, with multiple solder bumps provided on the chip and an empty space between several of the solder bumps.
Figure 1C:
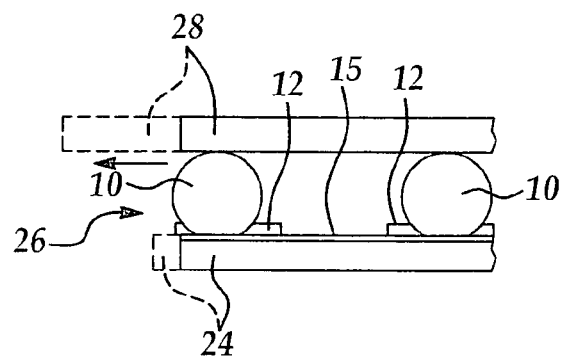
FIG. 1C is a side view of a flip chip, with a PCB substrate bonded to the solder bumps of the flip chip, more particularly illustrating relative rates of expansion of the PCB substrate and the chip substrate of the flip chip during high-temperature testing of the flip chip.
Figure 2:
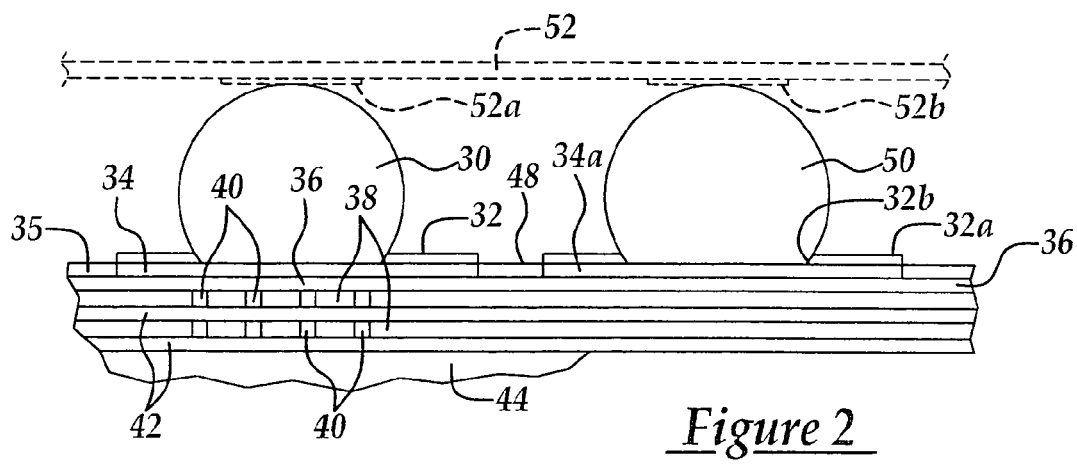
FIG. 2 is a cross-sectional view illustrating a functional solder bump and anchoring solder bump construction of a semiconductor flip chip according to a first embodiment of the method of the present invention.
Figure 3:
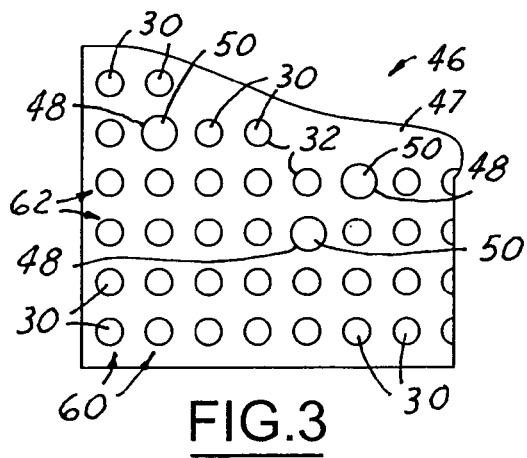
FIG. 3 is a top view of the flip chip of FIG. 2, illustrating multiple anchoring solder bumps provided in formerly empty spaces on the flip chip according to a first embodiment of the method of the present invention.

Referring to FIGS. 2 and 3, a corner section of a flip chip 46 according to a first embodiment of the method of the present invention is shown in FIG. 3 and includes multiple functional solder bumps 30 provided on an upper surface 47 of the flip chip 46 typically in multiple columns 60 and rows 62. As shown in FIG. 2, each solder bump 30 is typically soldered directly to the continuous upper surface of a bump pad 34 which may be partially covered by a passivation layer 32 of SiN or $SiO_2$, for example, according to techniques which are well-known by those skilled in the art. Each solder bump 30 is typically a mixture of lead and tin and may have a composition of typically about 5% Sn and 95% Pb, although other materials and mixtures may be used. The bump pad 34 is surrounded by the dielectric layer 35 in the chip 46. The bump pad 34 may be provided in electrical contact with an upper conductive layer 36, which is typically separated from an underlying conductive layer 42 by an insulative layer 38. The conductive layers 36, 42 may be disposed in electrical contact with each other through conductive vias 40 that extend through the insulative layers 38. The various insulative layers 38 and conductive layers 42 are sequentially deposited on a silicon chip substrate 44 throughout semiconductor fabrication, typically in conventional fashion. As shown in FIG. 3, the solder bumps 30 are typically arranged in the columns 60 and rows 62 on the surface 47 of the flip chip 46. Due to the pattern of integrated circuits on the flip chip 46, a regularly-repeating pattern of equally-spaced functional solder bumps 30 on the flip chip 46 is not necessary for flip chip functioning. Accordingly, each of the columns 60 and rows 62 typically includes one or more empty spaces 48 interspersed among and between adjacent solder bumps 30, depending on the pattern of integrated circuits fabricated on the flip chip 46. Each of the empty spaces 48 between adjacent functional solder bumps 30 may have a width of from typically about 150 um to about 250 um, for the width of a single bump space. In the event that the empty space 48 is the size of two bumps, the width of the empty space 48 will be double, or about 300 um to about 500 um. However, this width may vary depending on the particular application of the flip chip 46. As used herein, the term, "empty space" shall be construed to mean any vacant area which is between adjacent functional solder bumps on a flip chip and which would be capable of accommodating an additional functional solder bump were such additional functional solder bump necessary for proper functioning of the flip chip.

As further shown in FIG. 3, in accordance with the present invention, an anchoring solder bump 50 is provided on the flip chip 46 in each of the empty spaces 48 typically wherever the empty spaces 48 occur between adjacent solder bumps 30 in the columns 60 and rows 62 of solder bumps 30 on the flip chip 46. As further shown in FIG. 2, this may be accomplished by providing an anchoring bump pad 34a on the top conductive layer 36 underlying the dielectric layer 35 in each of the empty spaces 48 between adjacent solder bumps 30. A passivation layer 32a having a pad opening 32b may be provided on the anchoring bump pad 34a. Each anchoring solder bump 50 is soldered directly to the corresponding anchoring bump pad 34a and extends through the pad opening 32b of the passivation layer 32a. Each of the anchoring solder bumps 50 may have a composition which is the same as or different than that of the functional solder bumps 30. Next, the chip 46 is inverted and the solder bumps 30 are bonded to respective terminal bonding pads 52a that are connected to electrical terminals (not shown) on a PCB substrate 52, according to the knowledge of those skilled in the art. In like manner, the anchoring solder bumps 50 are typically bonded to respective terminal bonding pads 52b on the PCB substrate 52. Accordingly, when the flip chip 46 is subsequently subjected to testing, particularly high-temperature testing during which the flip chip 46 may be subjected to temperatures of typically about 150 degrees C., the PCB substrate 52 expands faster than the flip chip 46. The anchoring solder bumps 50 are effective in contributing to equal distribution of the resulting shear stress among all the functional solder bumps 30, thus eliminating or at least minimizing the likelihood that the solder bumps 30 which are located adjacent to the anchoring solder bumps 50 and would otherwise be located adjacent to an empty space 48 on the flip chip 46 will be detached from the flip chip 46 or otherwise damaged by the sheer stress.

Figure 4:
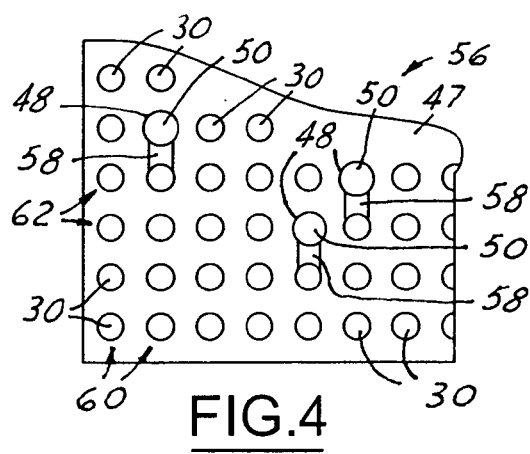
FIG. 4 is a top view of a flip chip illustrating multiple anchoring solder bumps provided in formerly empty spaces on a flip chip and a solder bridge connecting each anchoring solder bump to an adjacent functional solder bump on the chip according to a second embodiment of the method of the present invention.
Figure 5:
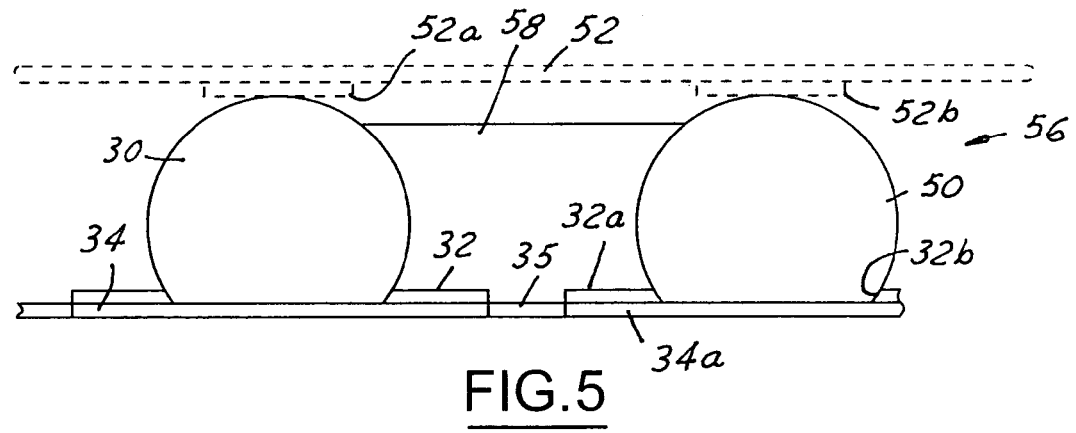
FIG. 5 is a side view of the flip chip of FIG. 4, illustrating a functional solder bump, anchoring solder bump and solder bridge construction of a semiconductor flip chip according to a second embodiment of the method of the present invention.

Referring next to FIGS. 4 and 5, a corner section of a flip chip 56 according to a second embodiment of the method of the present invention is shown in FIG. 4 and includes the multiple functional solder bumps 30 that are provided on the upper surface 47 of the flip chip 56 in multiple columns 60 and rows 62, as heretofore described with respect to the embodiment of FIGS. 2 and 3. Each of multiple anchoring solder bumps 50 may be soldered directly to the corresponding anchoring bump pad 34a and extend through a pad opening 32b of a passivation layer 32a, as shown in FIG. 5. A solder bridge 58 is then formed between the anchoring solder bump 50 and one of the adjacent functional solder bumps 30 on the flip chip 56. Next, the chip 46 is inverted and the solder bumps 30 are bonded to respective terminal bonding pads 52a that are connected to electrical terminals (not shown) on a PCB substrate 52. Each of the anchoring solder bumps 50 may be likewise bonded to respective terminal bonding pads 52b on the PCB substrate 52, according to the knowledge of those skilled in the art. Accordingly, when the flip chip 46 is subsequently subjected to testing including high-temperature testing, the PCB substrate 52 expands faster than the flip chip 46. The solder bridge 58 contributes to substantially equal distribution of shear stress between the functional solder bump 30 and the anchoring solder bump 50. Additionally, the anchoring solder bumps 30 facilitate substantially equal distribution among all of the functional solder bumps 30 on the flip chip 46, thus eliminating or at least minimizing the likelihood that the functional solder bumps 30 will be detached from the flip chip 46.

While the preferred embodiments of the invention have been described above, it will be recognized and understood that various modifications can be made in the invention and the appended claims are intended to cover all such modifications which may fall within the spirit and scope of the invention.

What is claimed is:

1. A method for preventing detachment of functional solder bumps from a flip chip having empty spaces between adjacent ones of the functional solder bumps, comprising the step of:
   stabilizing the functional solder bumps on the flip chip by providing an anchoring solder bump in each of at least a portion of the empty spaces.

2. The method of claim 1 wherein each of said empty spaces has a width of from about 150 um to about 500 um.

3. The method of claim 1 wherein said providing an anchoring solder bump in at least a portion of the empty spaces comprises the steps of providing an anchoring bump pad in each of the at least a portion of the empty spaces and providing said anchoring solder bump on said anchoring bump pad.

4. The method of claim 3 wherein each of said empty spaces has a width of from about 150 um to about 500 um.

5. The method of claim 1 wherein said anchoring solder bump is a material selected from the group consisting of lead, copper, silver and nickel.

6. The method of claim 5 wherein each of said empty spaces has a width of from typically about 150 um to about 500 um.

7. The method of claim 5 wherein said providing an anchoring solder bump in at least a portion of the empty spaces comprises the steps of providing an anchoring bump pad in each of the at least a portion of the empty spaces and providing said anchoring solder bump on said anchoring bump pad.

8. The method of claim 7 wherein each of said empty spaces has a width of from typically about 150 um to about 500 um.

9. The method of claim 1 further comprising the step of providing a solder bridge between said anchoring solder bump and one of the functional solder bumps.

10. The method of claim 9 wherein each of said empty spaces has a width of from typically about 150 um to about 500 um.

11. The method of claim 9 wherein said providing an anchoring solder bump in at least a portion of the empty spaces comprises the steps of providing an anchoring bump pad in each of the at least a portion of the empty spaces and providing said anchoring solder bump on said anchoring bump pad.

12. The method of claim 9 wherein said anchoring solder bump comprises lead.

13. A method for preventing detachment of functional solder bumps from a flip chip having empty spaces between adjacent ones of the functional solder bumps, comprising the steps of:
   stabilizing the functional solder bumps on the flip chip by providing anchoring solder bumps in at least a portion of the empty spaces, respectively; and
   providing a printed circuit board substrate on said functional solder bumps and said anchoring solder bumps.

14. The method of claim 13 wherein each of said empty spaces has a width of from typically about 150 um to about 500 um.

15. The method of claim 13 wherein said providing anchoring solder bumps in at least a portion of the empty spaces, respectively, comprises the steps of providing anchoring bump pads in the at least a portion of the empty spaces, respectively, and providing said anchoring solder bumps on said anchoring bump pads, respectively.

16. The method of claim 13 wherein each of said anchoring solder bumps comprises lead.

17. A method for preventing detachment of functional solder bumps from a flip chip having empty spaces between adjacent ones of the functional solder bumps, comprising the steps of:
   stabilizing the functional solder bumps on the flip chip by providing anchoring solder bumps in at least a portion of the empty spaces, respectively;
   providing a solder bridge between each of said anchoring solder bumps and one of the functional solder bumps; and
   providing a printed circuit board substrate on said functional solder bumps and said anchoring solder bumps.

18. The method of claim 17 wherein each of said empty spaces has a width of from typically about 150 um to about 500 um.

19. The method of claim 17 wherein said providing anchoring solder bumps in at least a portion of the empty spaces, respectively, comprises the steps of providing anchoring bump pads in the at least a portion of the empty spaces, respectively, and providing said anchoring solder bumps on said anchoring bump pads, respectively.

20. The method of claim 17 wherein each of said anchoring solder bumps comprises lead.

* * * * *